US012571097B2

(12) United States Patent
Terasaka et al.

(10) Patent No.: US 12,571,097 B2
(45) Date of Patent: Mar. 10, 2026

(54) LIQUID SOURCE VAPORIZATION APPARATUS, CONTROL METHOD FOR A LIQUID SOURCE VAPORIZATION APPARATUS AND PROGRAM RECORDING MEDIUM ON WHICH IS RECORDED A PROGRAM FOR A LIQUID SOURCE VAPORIZATION APPARATUS

(71) Applicant: HORIBA STEC, Co., Ltd., Kyoto (JP)

(72) Inventors: Masanori Terasaka, Irvine, CA (US);
Ryoichi Homma, Irvine, CA (US);
Fernandez Alexander, Irvine, CA (US)

(73) Assignee: HORIBA STEC, Co., Ltd., Kyoto (JP)

( * ) Notice: Subject to any disclaimer, the term of this patent is extended or adjusted under 35 U.S.C. 154(b) by 0 days.

(21) Appl. No.: 17/105,361

(22) Filed: Nov. 25, 2020

(65) Prior Publication Data

US 2021/0156027 A1     May 27, 2021

(30) Foreign Application Priority Data

Nov. 27, 2019     (JP) ................................. 2019-214198

(51) Int. Cl.
*C23C 16/455*     (2006.01)
*C23C 16/52*      (2006.01)
(Continued)

(52) U.S. Cl.
CPC ........ *C23C 16/45544* (2013.01); *C23C 16/52* (2013.01); *C23C 16/56* (2013.01); *G01F 1/00* (2013.01); *H01L 21/67069* (2013.01)

(58) Field of Classification Search
USPC .......................................................... 118/726
See application file for complete search history.

(56) References Cited

U.S. PATENT DOCUMENTS 5,966,499 A * 10/1999 Hinkle ................. B01J 19/0006
                                                            118/715
6,080,446 A *  6/2000 Tobe ....................... C23C 16/34
                                                            427/314

(Continued)

FOREIGN PATENT DOCUMENTS

CN          106996513 A     8/2017
CN          109519706 A     3/2019
(Continued)

OTHER PUBLICATIONS

Japan Patent Office, Office Action Issued in Application No. 2019214198, Sep. 5, 2023, 8 pages.

(Continued)

*Primary Examiner* — Ram N Kackar
(74) *Attorney, Agent, or Firm* — Alleman Hall LLP

(57)     ABSTRACT

There is provided a control valve that is provided on a flow path along which flows a source fluid which is a liquid source or a source gas obtained by vaporizing a liquid source, a pressure sensor that is provided on a downstream side of the control valve, a flow rate sensor that measures a flow rate of the source fluid, and a valve controller that, while reducing a deviation between a set pressure and a measured pressure measured by the pressure sensor, controls the control valve such that a measured flow rate measured by the flow rate sensor is equal to or less than a limit flow rate which is a flow rate that is set based on an upper limit flow rate at which the liquid source can still be vaporized.

15 Claims, 13 Drawing Sheets

(51) Int. Cl.

| | | |
|---|---|---|
| *C23C 16/56* | (2006.01) | |
| *G01F 1/00* | (2022.01) | |
| *H01L 21/67* | (2006.01) | |

(56) References Cited

U.S. PATENT DOCUMENTS

| | | | | |
|---|---|---|---|---|
| 6,471,781 | B1 * | 10/2002 | Tobe | C23C 16/45565 |
| | | | | 261/142 |
| 7,204,155 | B2 * | 4/2007 | Lane | C23C 16/45557 |
| | | | | 73/861 |
| 9,725,805 | B2 * | 8/2017 | Kobrin | C23C 16/4485 |
| 2003/0072875 | A1 * | 4/2003 | Sandhu | C23C 16/4486 |
| | | | | 118/692 |
| 2005/0181129 | A1 | 8/2005 | Olander | |
| 2005/0249874 | A1 * | 11/2005 | Hoshino | C23C 16/4485 |
| | | | | 118/726 |
| 2006/0144338 | A1 * | 7/2006 | Liu | C23C 16/4481 |
| | | | | 438/758 |
| 2014/0130801 | A1 * | 5/2014 | Cipolli | A61M 16/12 |
| | | | | 128/203.25 |
| 2014/0216339 | A1 * | 8/2014 | Nagase | C23C 16/4485 |
| | | | | 118/712 |

| | | | | |
|---|---|---|---|---|
| 2014/0356796 | A1 * | 12/2014 | Terasaka | B01D 1/0082 |
| | | | | 432/13 |
| 2017/0101715 | A1 * | 4/2017 | Nishizato | G01N 33/0004 |
| 2017/0122631 | A1 * | 5/2017 | Birkelund | F16K 37/0083 |

FOREIGN PATENT DOCUMENTS

| | | | |
|---|---|---|---|
| JP | H07227536 | A | 8/1995 |
| JP | 11131233 | A | 5/1999 |
| JP | 5350824 | B2 | 11/2013 |
| JP | 2017076800 | A | 4/2017 |
| KR | 1020010022301 | A | 3/2001 |
| KR | 1020170043468 | A | 4/2017 |
| TW | 428042 | B | 4/2001 |
| TW | 201714207 | A | 4/2017 |
| WO | 9904615 | A1 | 2/1999 |

OTHER PUBLICATIONS

Taiwan Intellectual Property Office, Office Action Issued in Application No. 109141853, May 23, 2024, 16 pages.
China National Intellectual Property Administration, Office Action Issued in Application No. 202011361749.0, Jan. 18, 2025, 27 pages.
Korean Intellectual Property Office, Office Action Issued in Application No. 10-2020-0161045, Jul. 24, 2025, 13 pages.

* cited by examiner

CONVENTIONAL TECHNOLOGY

CONVENTIONAL TECHNOLOGY

CONVENTIONAL TECHNOLOGY

LIQUID SOURCE VAPORIZATION APPARATUS, CONTROL METHOD FOR A LIQUID SOURCE VAPORIZATION APPARATUS AND PROGRAM RECORDING MEDIUM ON WHICH IS RECORDED A PROGRAM FOR A LIQUID SOURCE VAPORIZATION APPARATUS

TECHNICAL FIELD

The present invention relates to a liquid source vaporization apparatus that is used, for example, in a semiconductor manufacturing process.

TECHNICAL BACKGROUND

In ALD (Atomic Layer Deposition) and ALE (Atomic Layer Etching), in order to be able to achieve laminating and etching at an atomic layer level, while switching at high speed between ON periods during which source gas is supplied to the interior of a chamber and OFF periods during which the supply of source gas is stopped, during the ON periods it is necessary for a required fixed quantity of the source gas to be supplied to the chamber with excellent reproducibility. Moreover, in this type of semiconductor manufacturing process, the source gas that is used is obtained by vaporizing a liquid source.

In a case in which a source gas is generated by vaporizing a liquid source, if, for example, there are large variations in the pressure and flow rate of the source gas, then the liquid source may not be properly vaporized, and there is a possibility that the desired quantity of source gas will not be supplied to the chamber interior, or that the liquid source will be supplied to the chamber interior while still in a liquid state.

For this reason, in a semiconductor manufacturing system that is used in ALD or ALE, control is performed such that a fixed flow rate of source gas is constantly generated using a liquid source vaporization apparatus such as that shown, for example, in Patent Document 1. In addition, in the OFF periods, the source gas is vented so that no source gas is supplied to the chamber. More specifically, as is shown in FIG. 12, this semiconductor manufacturing system is provided with a liquid source vaporization apparatus 100A that vaporizes a liquid source by mixing the liquid source with a carrier gas, a supply line SL that connects the liquid source vaporization apparatus 100A to a chamber CN and is equipped with a first opening/closing valve V1, and a vent line VL that branches off from the supply line SL and is equipped with a second opening/closing valve V2. The liquid source vaporization apparatus 100A uses a control valve 1A to control the quantity of liquid source that is supplied, and control is performed such that the flow rate of the source gas flowing through the supply line SL remains constant. Moreover, the switching between the ON periods and the OFF periods which is prescribed by the manufacturing recipe is achieved by alternately switching the first opening/closing valve V1 and the second opening/closing valve V2 ON and OFF. In this way, a fixed quantity of source gas is supplied to the chamber CN interior in the ON periods.

However, in this type of source gas supply method, when the source gas is being discarded, a large quantity of high-cost liquid source also ends up being wasted. More specifically, as is shown in FIG. 13(*a*), which is a timing chart showing open and closed states of the first opening/closing valve V1, the second opening/closing valve V2, and the control valve 1A, in a state in which the first opening/ closing valve V1 is OFF and the second opening/closing valve V2 is ON, the control valve 1A is also ON. Because of this, in areas indicated by diagonal lines, the liquid source is vaporized and is discarded as a gas from the vent line VL.

In contrast, in a case in which the batch size of the substrates being processed within the chamber CN is large, so that there is both a long ON period and a long OFF period, then as is shown in FIG. 13(*b*), by also switching the control valve 1A ON and OFF in synchronization with the ON and OFF of the second control valve V2, the quantity of the liquid source that is consumed is reduced. However, even in a control state such as this, because of the fact that, in order to supply a constant flow rate of source gas in the ON period, the control valve 1A must be switched ON prior to the start of this ON period, and the fact that a first-order delay is generated in the flow rate control, as is shown by the diagonal lines, a portion of the source gas unavoidably ends up being discarded from the vent line VL.

DOCUMENTS OF THE PRIOR ART

Patent Documents

[Patent Document 1] Japanese Patent Publication No. 5350824

DISCLOSURE OF THE INVENTION

Problems to be Solved by the Invention

The present invention was therefore conceived in order to solve the above-described problems, and provides a liquid source vaporization apparatus that, while maintaining a state in which a liquid source can be sufficiently vaporized, is able to perform control while changing a flow rate and pressure of a source gas to desired values, and is thereby able to reduce the quantity of source gas that is discarded, for example, from a vent line.

Means for Solving the Problem

In other words, a liquid source vaporization apparatus according to the present invention is characterized in being provided with a control valve that is provided on a flow path along which flows a source fluid which is a liquid source or a source gas obtained by vaporizing a liquid source, a pressure sensor that is provided on a downstream side of the control valve, a flow rate sensor that measures a flow rate of the source fluid, and a valve controller that, while reducing a deviation between a set pressure and a measured pressure measured by the pressure sensor, controls the control valve such that a measured flow rate measured by the flow rate sensor is equal to or less than a limit flow rate which is a flow rate that is set based on an upper limit flow rate at which the liquid source can still be vaporized.

Moreover, a control method according to the present invention is a control method for a liquid source vaporization apparatus that is provided with a control valve that is provided on a flow path along which flows a source fluid which is a liquid source or a source gas obtained by vaporizing a liquid source, a pressure sensor that is provided on a downstream side of the control valve, and a flow rate sensor that measures a flow rate of the source fluid, and is characterized in that the control valve is controlled such that, at the same time as a deviation between a set pressure and a measured pressure measured by the pressure sensor is reduced, a measured flow rate measured by the flow rate sensor is equal to or less than a limit flow rate which is a flow rate that is set based on an upper limit flow rate at which the liquid source can still be vaporized.

According to the above-described structure and method, even if a set pressure is altered so that a flow rate and pressure of a source gas that is supplied from a downstream side of the control valve is altered, because the flow rate of the source fluid is limited to a flow rate at which the liquid source can still be vaporized, it is possible to prevent the liquid source from being supplied in a liquid state to the downstream side of the control valve.

Moreover, because it is possible to ensure that the liquid source is not supplied to the downstream side of the control valve, even in a case in which the supply of a source gas is repeatedly started and stopped, as in, for example, an ALD/ALE process, it is still possible to increase or decrease the flow rate of the source gas using the control valve so as to correspond to this starting and stopping. Accordingly, it is no longer necessary to provide a vent line between the control valve and the object being supplied, and to discard source gas during periods when the source gas is not being supplied.

An example of a specific control structure that is used to perform control using a single control valve such that, while the flow rate of the source fluid is kept equal to or less than the limit flow rate, and the vaporization of the liquid source is guaranteed, the pressure of the source fluid flowing on the downstream side of the control valve is kept constant, is a structure in which the valve controller is provided with a first manipulated variable calculation unit that, based on a deviation between the measured flow rate and the limit flow rate calculates a first manipulated variable which is a manipulated variable of the control valve, a second manipulated variable calculation unit that, based on a deviation between the measured pressure and the set pressure calculates a second manipulated variable which is a manipulated variable of the control valve, and a manipulated variable deciding unit that compares the first manipulated variable with the second manipulated variable and inputs one of these manipulated variables into the control valve.

In order to ensure that a target on the side that, out of the upper limit flow rate and the set pressure, deviates the most from the measured values is employed in the manipulated variable deciding unit, and to ensure that the control valve is controlled such that either deviation is reduced within a short span of time, it is also possible for the control valve to be a normally open type of valve that is in a fully open state when no voltage is being supplied thereto, and for the manipulated variable deciding unit to input whichever is the larger manipulated variable out of the first manipulated variable and the second manipulated variable into the control valve. In addition, in the same way, it is also possible for the control valve to be a normally closed type of valve that is in a fully closed state when no voltage is being supplied thereto, and for the manipulated variable deciding unit to input whichever is the smaller manipulated variable out of the first manipulated variable and the second manipulated variable into the control valve.

An example of another control aspect that, while ensuring that the flow rate of the source fluid is equal to or less than the limit flow rate, and that vaporization of the liquid source is guaranteed, ensures that the pressure of the source fluid on the downstream side of the control valve is kept constant, is a structure in which the valve controller is provided with a flow rate control unit that controls the control valve based on a deviation between the measured flow rate and a set flow rate, and a flow rate setting unit that sets a set flow rate that is equal to or less than the limit flow rate in the flow rate control unit such that the deviation between the measured pressure and the set pressure is reduced.

An example of a specific structure that, by altering the set flow rate, enables the pressure of the source fluid on the downstream side of the control valve to track a set pressure, is a structure in which, in a case in which the measured pressure is larger than the set pressure, the flow rate setting unit alters the set flow rate to a direction in which the set flow rate is reduced, and in a case in which the measured pressure is smaller than the set pressure, the flow rate setting unit alters the set flow rate to a direction in which the set flow rate is increased.

If a structure is employed in which the liquid source flows on an upstream side of the control valve, and a source gas obtained by vaporizing the liquid source flows on the downstream side of the control valve, and the flow rate sensor is provided on the upstream side of the control valve and measures the flow rate of the liquid source, then because the flow rate of the liquid source is measured directly, it is possible to more accurately prevent the flow rate from becoming a flow rate at which the liquid source is unable to be vaporized.

An example of a specific structure that, for example, by using a flow rate sensor for operating at high temperatures, enables the flow rate of the source gas flowing on the downstream side of the control valve to be fed back directly, so as to make it difficult for any time delay to be generated in the flow rate of the source gas, and thereby prevents vaporized gas obtained by vaporizing the liquid source from being reliquefied is a structure in which the liquid source flows on the upstream side of the control valve, and a source gas obtained by vaporizing the liquid source flows on the downstream side of the control valve, and the flow rate sensor is provided on the downstream side of the control valve and measures the flow rate of the source gas Another example of an aspect of the present invention is a structure in which a liquid source contained within a tank is heated by a heater, and the resulting vaporized source gas is discharged from the tank interior into the flow path, and the flow rate sensor is provided on the upstream side of the control valve and measures the flow rate of the source gas.

An example of a specific structure that enables a source gas to be supplied directly to the control valve, and thereby ensures that a liquid source does not flow to the downstream side of this control valve is a structure in which a liquid source contained within a tank is heated by a heater, and the resulting vaporized source gas is discharged from the tank interior into the flow path, and the flow rate sensor is provided on the upstream side of the control valve and measures the flow rate of the source gas. If this type of structure is employed, then because the control valve is controlled such that the flow rate does not become too fast for source gas to be generated from the liquid source inside the tank, it is possible to prevent a problematic situation from arising in which, for example, due to an inability to ensure a sufficient vaporization supply, the control valve is continuously maintained in a fully closed or a fully open state, so that a state in which any deviation does not get reduced continues to exist.

For example, in order to enable vaporized source gas to be supplied in parallel to a plurality of supply objects, it is also possible for the flow path to be formed by a main flow path, and by a plurality of branch paths that branch off from the downstream side of the main flow path, and for the respective branch flow paths to be individually connected to mutually different source gas supply objects.

In order to enable source gases having mutually different pressures to be individually supplied to the respective supply objects from a single liquid source supply source, it is also possible for one of the control valves to be individually provided on each branch flow path.

For example, in order to enable the flow rate of a source fluid after it has passed through the control valve to be limited to a predetermined value, and to thereby enable the vaporization state to be stabilized, it is also possible for there to be further provided a nozzle that is disposed on the flow path.

In order to lessen pulsations in the pressure of the source gas supplied to the supply object, it is also possible for there to be further provided a buffer tank that is disposed on the downstream side of the control valve.

If a structure is employed in which the downstream side of the control valve is connected to a supply object to which a source fluid in a vaporized state is supplied, and all of the source fluid that has passed through the control valve flows into this supply object, then it is possible for all of the source gas to be supplied to the supply object, and for wasted source gas to thereby be eliminated.

In order to enable the same effects as those obtained from the present invention to be achieved simply by updating a program in an existing liquid source vaporization apparatus, it is also possible to use a program for a liquid source vaporization apparatus that includes a control valve that is provided on a flow path along which flows a source fluid which is a liquid source or a source gas obtained by vaporizing a liquid source, a pressure sensor that is provided on a downstream side of the control valve, and a flow rate sensor that measures a flow rate of the source fluid, characterized in that the program for a liquid source vaporization apparatus causes a computer to function as a valve controller that, while reducing a deviation between a set pressure and a measured pressure measured by the pressure sensor, controls the control valve such that a measured flow rate measured by the flow rate sensor is equal to or less than a limit flow rate which is a flow rate that is set based on an upper limit flow rate at which the liquid source can still be vaporized.

Note that the program for a liquid source vaporization apparatus may be distributed electronically, or may be recorded on a program recording medium such as a CD, DVD, or flash memory.

Effects of the Invention

According to the liquid source vaporization apparatus according to the present invention, it is possible while performing control to ensure that the pressure of a source fluid on the downstream side of the control valve tracks a set pressure, to limit the flow rate to within a limit flow rate at which the liquid source is able to be vaporized. Accordingly, it is possible to attain the desired pressure control, while preventing a liquid source from being supplied to the downstream side of the control valve without having been vaporized first. Moreover, it is no longer necessary to continuously maintain a constant flow rate of the source gas that is supplied from the liquid source vaporization apparatus in order to ensure that the vaporization state of the liquid source remains constant, as is the case in the conventional technology, and, as a result, it is possible to vary the flow rate. Accordingly, it is no longer necessary to expel generated source gas from a vent line in order to stop the supply of source gas to a supply object, as is the case in the conventional technology, so that, as a result, the quantity of wasted liquid source can be reduced.

BEST EMBODIMENTS FOR IMPLEMENTING THE INVENTION

A liquid source vaporization apparatus 100 and a semiconductor manufacturing system 200 according to a first embodiment of the present invention will now be described with reference to FIG. 1 through FIG. 7.

The semiconductor manufacturing system 200 of the first embodiment is used, for example, in an ALD/ALE process, and supplies source gas obtained by vaporizing a liquid source to a supply object in the form of a chamber CN. Note that the source gas referred to in this Specification is a concept that includes film-formation component gases, and gases that are required in order to advance the processes performed inside the chamber CN, such as etching gas and the like. Moreover, the actual liquid source itself, a source gas obtained by vaporizing the liquid source, and a mixture gas obtained by mixing together a source gas and a carrier gas may also be referred to collectively as source fluids.

Figure 1:
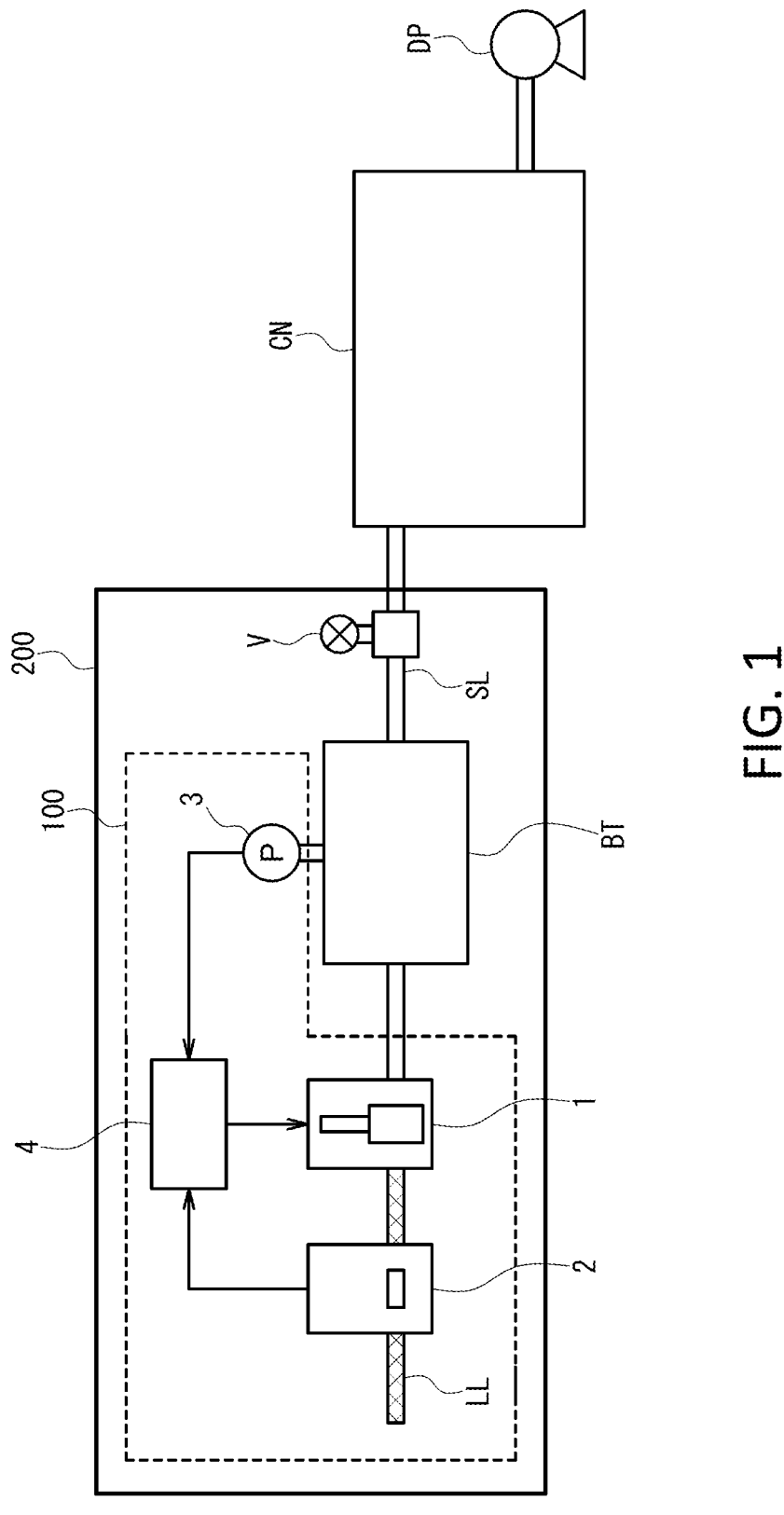
FIG. 1 is a schematic view showing a liquid source vaporization apparatus according to a first embodiment of the present invention.

As is shown in FIG. 1, in this semiconductor manufacturing system 200, the liquid source vaporization apparatus 100 and the chamber CN are connected together by a supply line SL, and there are also provided a buffer tank BT and a supply valve V. Note that, depending on how the semiconductor manufacturing system 200 is to be used, there may be cases in which the buffer tank BT is not provided. In addition, valve openings and valve closings of the supply valve V are controlled, for example, by a control device that performs overall control of the semiconductor manufacturing system 200, and the liquid source vaporization apparatus 100 does not directly control the supply valve V. It is also possible to configure the semiconductor manufacturing system 200 so that the liquid source vaporization apparatus 100 does control the supply valve V. Moreover, while processing is progressing within the chamber CN, even if the supply of source gas is stopped temporarily, no vent line is used. In other words, the semiconductor manufacturing system 200 of the first embodiment is configured such that there is no discarding of source gas while processing is progressing within the chamber CN. For this reason, in FIG. 1, no vent line is shown branching off from the supply line SL.

Next, the liquid source vaporization apparatus 100 will be described in detail. This liquid source vaporization apparatus 100 is an injection type of vaporization apparatus that supplies a liquid source without using a carrier gas, and vaporizes the liquid source using decompression.

The liquid source vaporization apparatus 100 is provided on a liquid line LL along which the liquid source flows without a carrier gas, and is provided with a flow rate sensor 2 that measures a flow rate of the liquid source, a control valve 1 that is interposed between the liquid line LL and the supply line SL, a pressure sensor 3 that measures a pressure inside the buffer tank BT which is located on the supply line SL on a downstream side of the control valve 1, and a valve controller 4 that controls the control valve 1 based on measured values obtained by the flow rate sensor 2 and the pressure sensor 3.

Here, because the downstream side of the control valve 1 is evacuated by a dry pump DP that is provided in the chamber CN, the downstream side of the control valve 1 is decompressed to a predetermined pressure (i.e., a predetermined degree of vacuum). Consequently, the liquid source that has passed through the control valve 1 and is injected into the interior of the supply line SL is decompressed and, as a result of this, is vaporized so as to be placed in a source gas state. It is also possible for the supply line SL to be heated to a predetermined temperature at which vaporization of the liquid source is able to progress more easily.

The flow rate sensor 2 measures the flow rate of a fluid, and various types of flow rate sensors that employ various types of measurement principles such as pressure type flow rate sensors, thermal type flow rate sensors, and Coriolis type flow rate sensors or the like may be used.

The control valve 1 is, for example, a piezo valve that is able to accommodate being switched at high-speed between ON and OFF (i.e., between a fully open state and a fully closed state). In addition, the control valve 1 of the first embodiment is a normally open type valve that is in a fully open state when voltage is not being supplied thereto.

The valve controller 4 controls the control valve 1 such that the pressure of the source gas in the supply line SL is kept constant at a predetermined pressure, and such that a liquid source is supplied from the liquid line LL to the supply line SL at a flow rate that is equal to or less than an upper limit of the flow rate for vaporizing the liquid source. More specifically, the valve controller 4 controls the control valve 1 such that the measured flow rate as measured by the flow rate sensor 2 remains equal to or less than a limit flow rate, which is a flow rate that is set based on an upper limit of the flow rate at which the liquid source is still able to be vaporized, at the same time as any deviation between the set pressure and the measured pressure as measured by the pressure sensor 3 is being reduced.

In other words, in the first embodiment, in order to control the single control valve 1, a pressure feedback loop that controls the pressure of the source gas within the supply line SL, and a flow rate feedback loop that controls the flow rate of the liquid source within the supply line SL are formed, and both of these two different types of feedback loop are operated using the single control valve 1. As a result of the control system being configured in this way, two types of target values are achieved using a single control valve.

Figure 2:
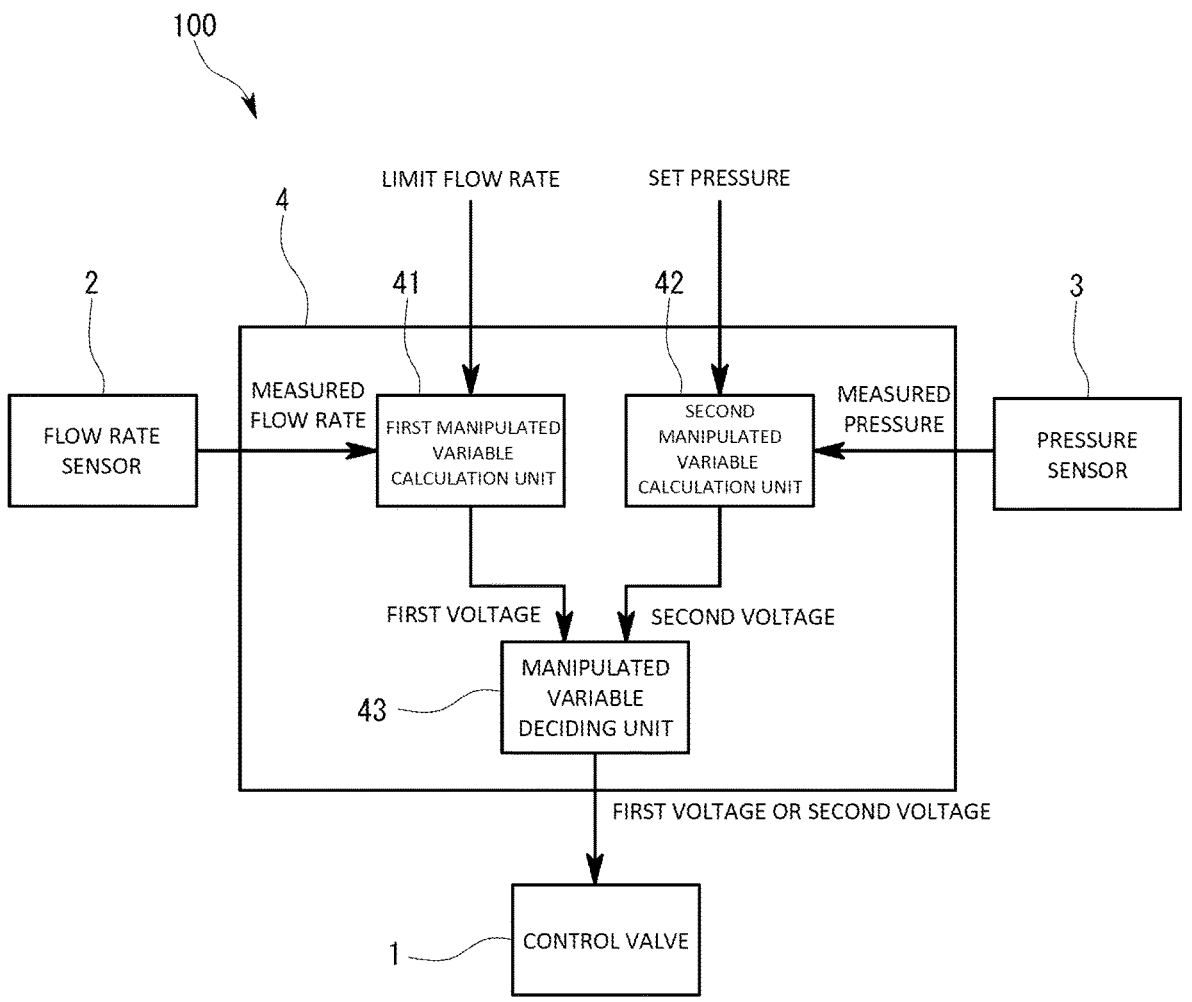
FIG. 2 is a function block diagram showing the liquid source vaporization apparatus of the first embodiment.

The valve controller 4 will now be described in detail with reference to FIG. 2.

The valve controller 4 is what is commonly called a computer that includes a CPU, memory, an A/D converter, a D/A converter and various types of input/output devices. As a result of a program for a liquid source vaporization apparatus that is stored in the memory being executed, the valve controller 4 operates in collaboration with various other instruments so as to perform the functions of at least a first manipulated variable calculation unit 41, a second manipulated variable calculation unit 42, and a manipulated variable deciding unit 43.

The first manipulated variable calculation unit 41 calculates a first voltage, which is a first manipulated variable of the control valve 1, based on a deviation between a measured flow rate and a limit flow rate. Here, the limit flow rate is a value that is set based on the upper limit flow rate at which the liquid source is still able to be vaporized, and the limit flow rate is set to a smaller value than the upper limit flow rate. Here, the upper limit flow rate is measured in advance by means of experiments and simulations based on whether or not any liquid source remains after having passed through the control valve 1. This upper limit flow rate and limit flow rate are stored in the memory, and the stored values may either be set automatically for the first manipulated variable calculation unit 41, or limit flow rates may be set successively by means of external inputs made by a user or the like.

The second manipulated variable calculation unit 42 calculates a second voltage, which is a second manipulated variable of the control valve 1, based on a deviation between a measured pressure and a set pressure.

The manipulated variable deciding unit 43 compares the first voltage with the second voltage, and inputs the larger of these voltages into the control valve 1.

Figure 3:
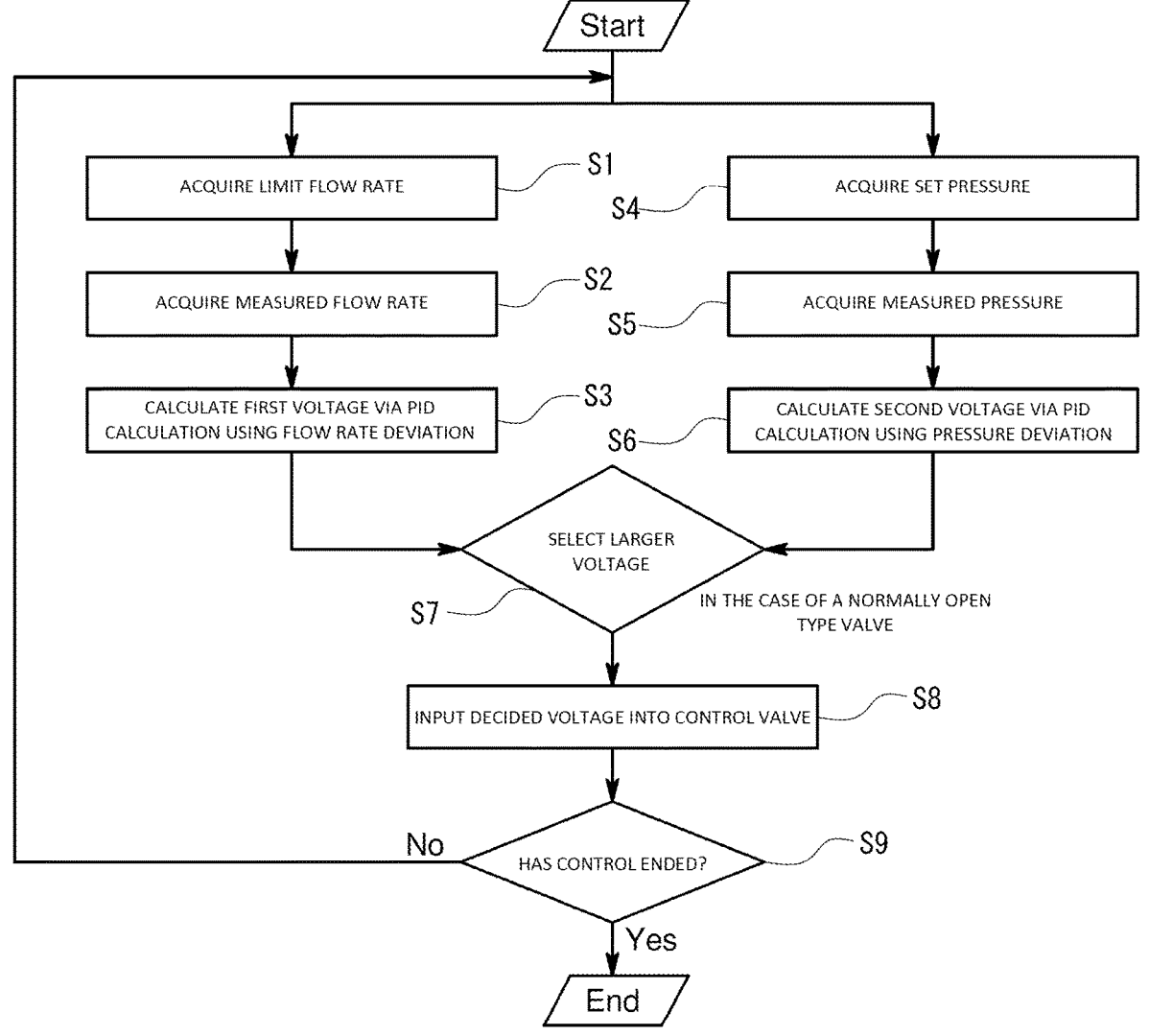
FIG. 3 is a flow chart showing an operation of the liquid source vaporization apparatus of the first embodiment.

An operation of the liquid source vaporization apparatus 100 that is formed in the above manner will now be described with reference to the flow chart shown in FIG. 3.

The first manipulated variable calculation unit 41 and the second manipulated variable calculation unit 42 each simultaneously calculate manipulated variables in parallel with each other.

More specifically, the first manipulated variable calculation unit 41 acquires a limit flow rate (step S1), and then acquires a measured flow rate from the flow rate sensor 2 (step S2). In addition, the first manipulated variable calculation unit 41 calculates a deviation between the limit flow rate and the measured flow rate, and calculates a first voltage by performing a PID calculation on the calculated flow rate deviation (step S3). In this way, the first manipulated variable calculation unit 41 calculates the first voltage using flow rate feedback from the liquid source.

In the same way, the second manipulated variable calculation unit 42 acquires a set pressure (step S4), and then acquires a measured pressure from the pressure sensor 3 (step S5). In addition, the second manipulated variable calculation unit 42 calculates a deviation between the set pressure and the measured pressure, and calculates a second voltage by performing a PID calculation on the calculated pressure deviation (step S6). In this way, the second manipulated variable calculation unit 42 calculates the second voltage using pressure feedback from the downstream side of the control valve 1.

The manipulated variable deciding unit 43 determines which of the first voltage and the second voltage is the larger (step S7), and inputs this larger voltage into the control valve 1 (step S8).

Lastly, a determination is made as to whether or not this control is still continuing (step S9), and if the control is continuing then step S1 through step S8 are repeated.

Next, changes in the first voltage and second voltage that are calculated in the valve controller 4 by the control side that was described based on the flow chart shown in FIG. 3, and changes in the pressure and flow rate that are generated from the control results will be described with reference to FIG. 4 through FIG. 7. Here, portions indicated by solid lines in the graphs of the measured pressure and measured flow rate show that voltages calculated by feeding back measured values have been applied to the control valve 1. In addition, portions indicated by dotted lines show that voltages calculated by feeding back other different measured quantities have been applied to the control valve 1. In the same way, portions indicated by a solid line in the graphs of each voltage show the values that were actually input into the control valve 1 by the manipulated variable deciding unit 43, while portions indicated by a dotted line show that no values were input into the control valve 1.

Figure 4:
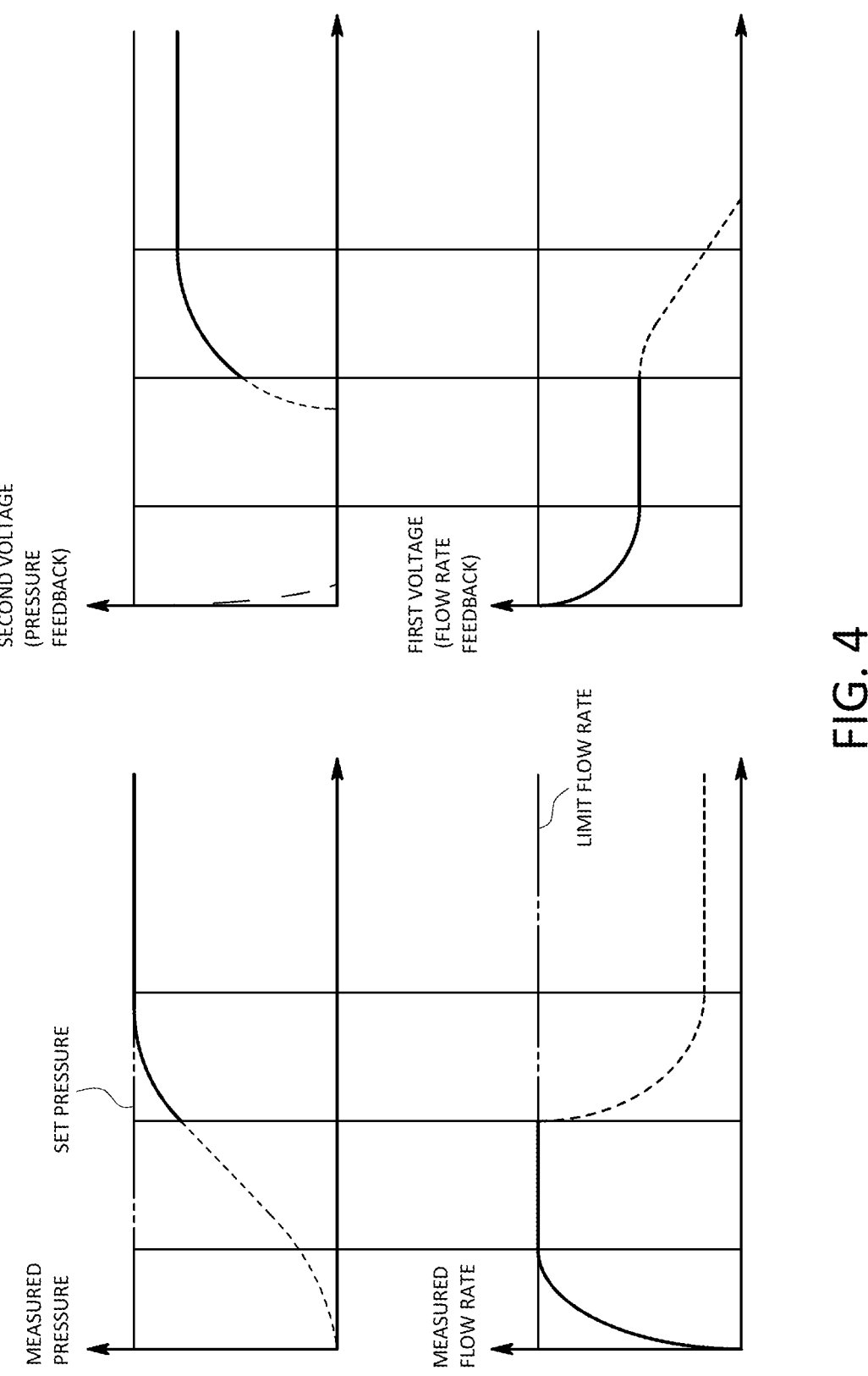
FIG. 4 is a first example of simulation results showing respective measurement values measured by the liquid source vaporization apparatus of the first embodiment, and changes over time in each manipulated variable.

The graphs in FIG. 4 show changes in the respective voltages in a case in which the supply valve V is closed so that there is no inflow of source gas into the chamber CN, and the measured pressure is altered from a zero state to the set pressure. As is shown in FIG. 4, in an initial period when control is started, because the first voltage has been calculated to be a larger value than the second voltage, the first voltage which is calculated using flow rate feedback is applied to the control valve 1. As a result of this, the flow rate of the liquid source rises rapidly from zero to the limit flow rate and is then maintained at the limit flow rate. In a state in which the flow rate of the liquid source is being maintained at the limit flow rate, because a source gas obtained by vaporizing the liquid source is continuously supplied to the downstream side of the control valve 1, there is a rise in the measured pressure. Moreover, a state in which there is a small deviation between the limit flow rate and the measured flow rate is maintained, and the deviation between the set pressure and the measured pressure is relatively larger, so that the calculated second voltage is larger than the first voltage. As a result of this, subsequently, the second voltage which is calculated using pressure feedback is applied to the control valve 1. In this way, at the same time as the flow rate of the liquid source is maintained at equal to or less than the limit flow rate, the pressure on the downstream side of the control valve 1 is maintained at the set pressure.

Figure 5:
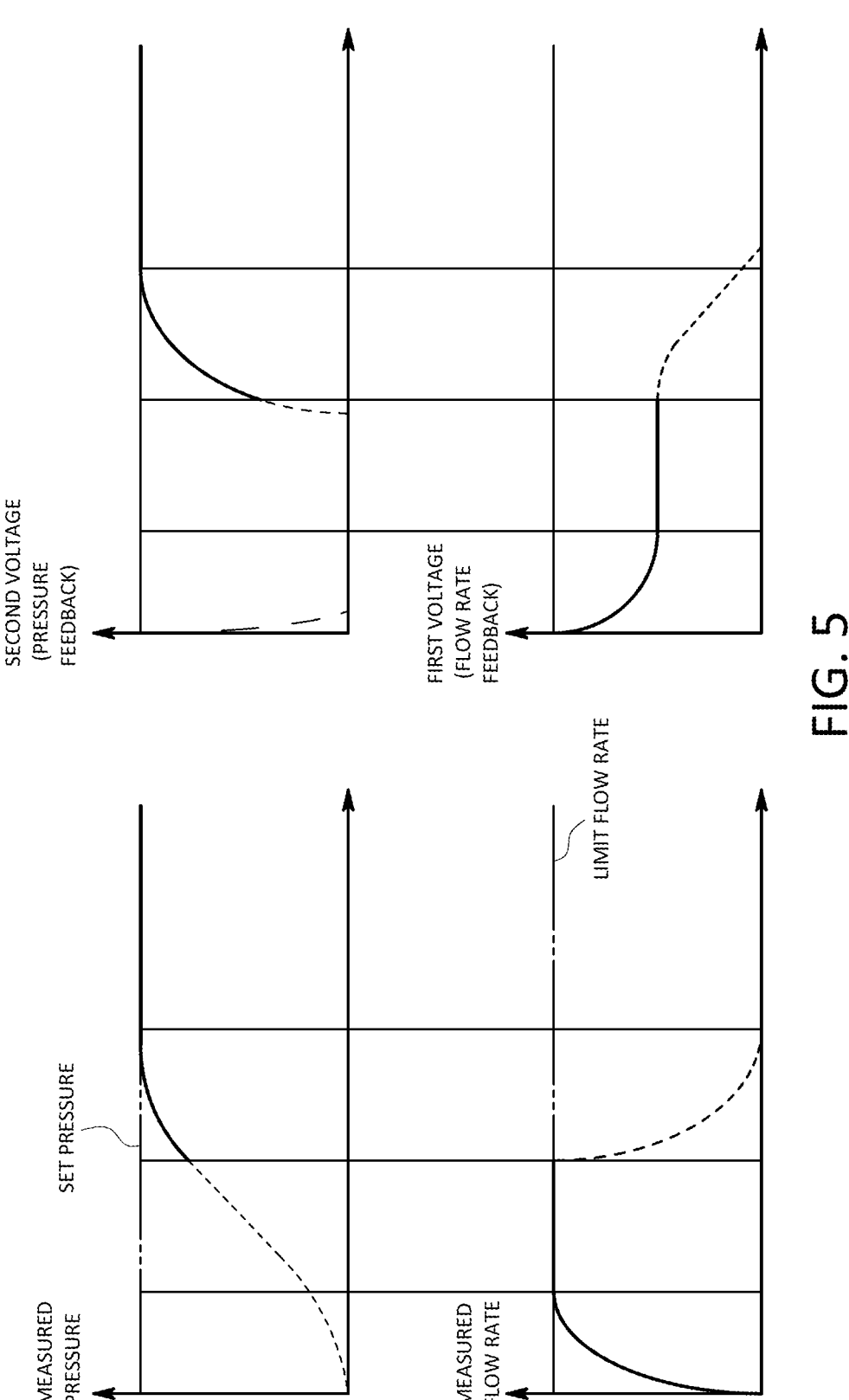
FIG. 5 is a second example of simulation results showing respective measurement values measured by the liquid source vaporization apparatus of the first embodiment, and changes over time in each manipulated variable.

The graphs in FIG. 5 show changes in the respective voltages in a case in which the supply valve V is closed so that there is an inflow of source gas into the chamber CN, and the measured pressure is altered from a zero state to the set pressure, and also show changes in the pressure and flow rate. The graphs in FIG. 5 show substantially the same modes of change as the graphs in FIG. 4, however, a longer time is required for the pressure to rise due to the inflow of source gas into the chamber CN. Accordingly, the timing of the switch from the first voltage to the second voltage is delayed.

Figure 6:
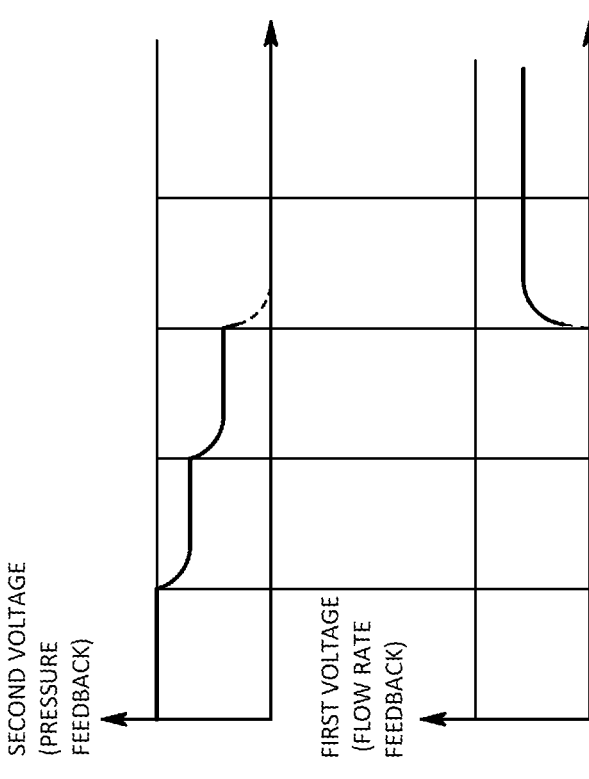
FIG. 6 is a third example of simulation results showing respective measurement values measured by the liquid source vaporization apparatus of the first embodiment, and changes over time in each manipulated variable.
Figure 6:
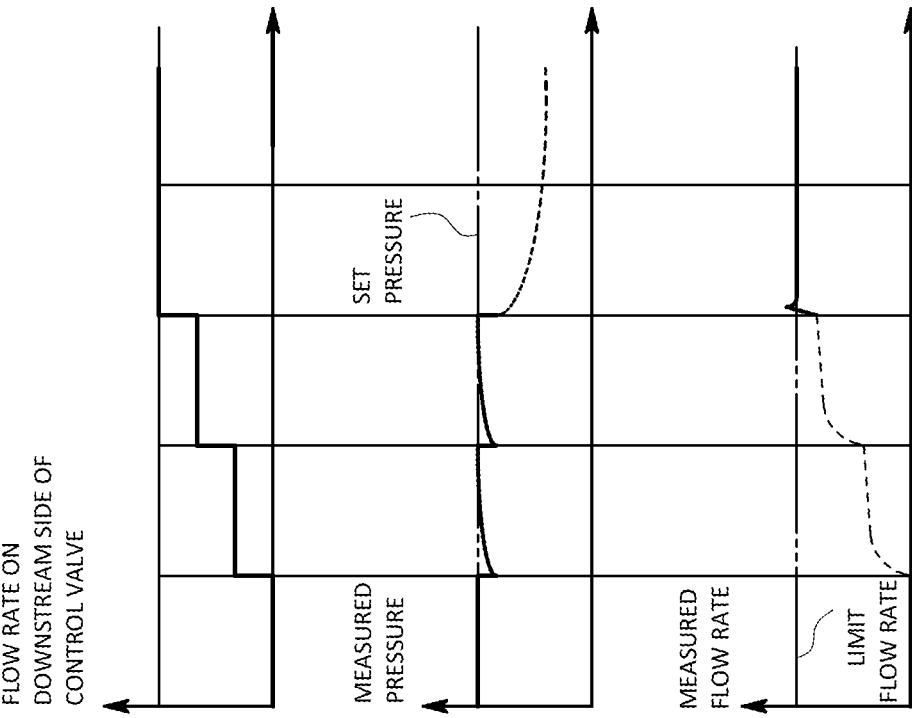

The graphs in FIG. 6 show changes in the respective voltages in a case in which the flow rate on the downstream side of the control valve 1 is raised in a plurality of steps, and also show changes in the pressure and flow rate. Even if the flow rate on the downstream side of the control valve 1 rises, for a short period the second voltage which has been calculated using pressure feedback continues to be applied to the control valve 1. More specifically, if there is an increase in the flow rate on the downstream side of the control valve 1, then the value of the second voltage that is applied to the control valve 1 in order to maintain the measured pressure at the set pressure is reduced in steps, and the valve opening is altered by being increased little by little. As a result of this, because there is an increase in the flow rate of liquid source passing through the control valve 1, the quantity of source gas flowing into the downstream side of the control valve 1 increases so that the measured pressure is maintained at the set pressure. In contrast, if the flow rate on the downstream side of the control valve 1 becomes larger than a predetermined value, then the measured flow rate of the liquid source approaches a value close to the limit flow rate. Because the first voltage is calculated from this point in time as being a larger value than the second voltage, there is a switch to flow rate feedback control, and the measured flow rate is maintained at the limit flow rate.

Figure 7:
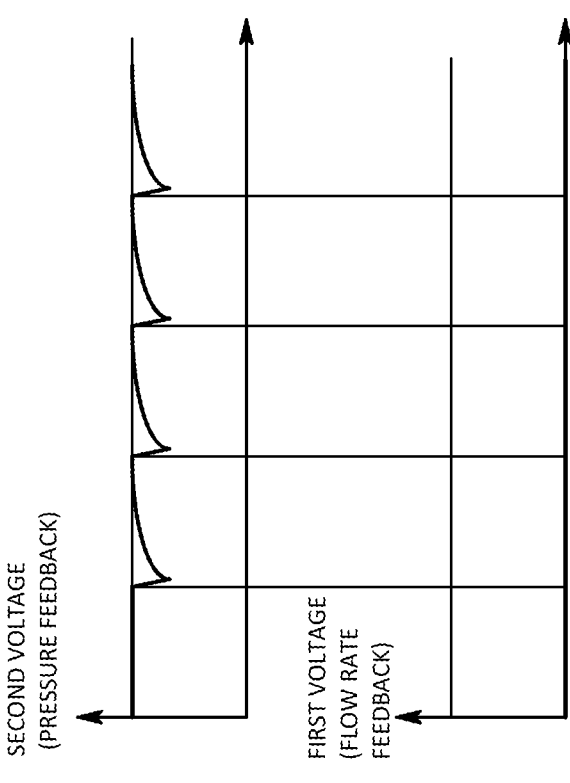
FIG. 7 is a fourth example of simulation results showing respective measurement values measured by the liquid source vaporization apparatus of the first embodiment, and changes over time in each manipulated variable.
Figure 7:
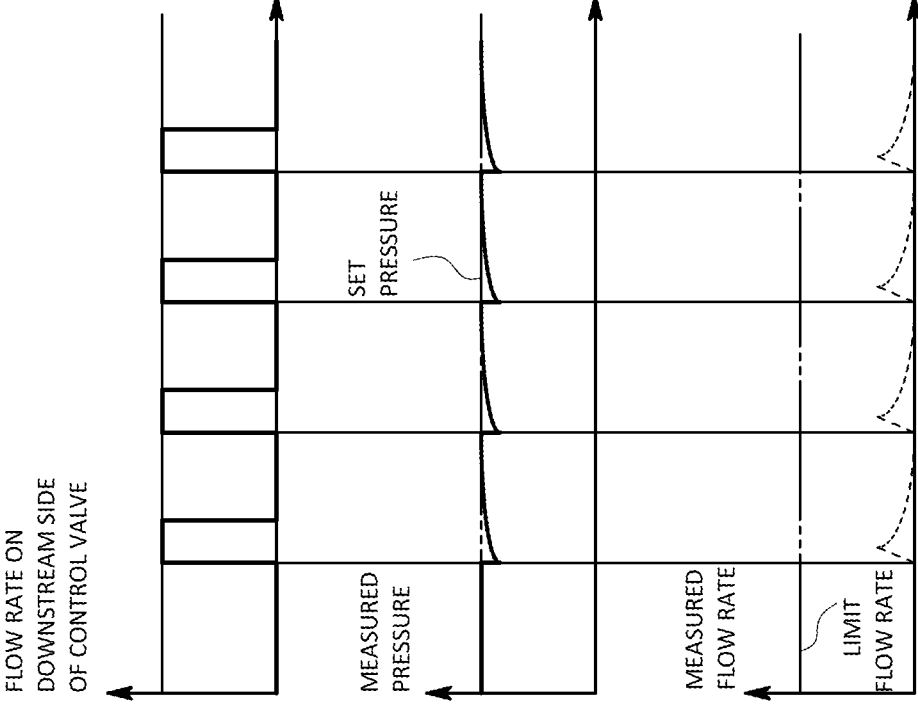

The graphs in FIG. 7 show changes in the respective voltages in a case in which the supply valve V is switched in pulses between ON and OFF, and also show changes in the pressure and flow rate. In this case, because there is substantially no change in the flow rate on the downstream side of the control valve 1, the valve controller 4 continues to apply the second voltage which is calculated using pressure feedback to the control valve 1.

In this way, according to the liquid source vaporization apparatus 100 of the first embodiment, the first voltage which is obtained using flow rate feedback in the normally open type control valve 1 is compared to the second voltage which is obtained using pressure feedback, and whichever of these is the larger is applied to the control valve 1. As a result, the flow rate of the liquid source is maintained at equal to or less than the limit flow rate which is smaller than the upper limit flow rate at which vaporization of the liquid source is still possible, and in conjunction with this, the pressure on the downstream side of the control valve 1 can be maintained at a desired set pressure.

As a result, even if ON/OFF control of the supply valve V is performed so that changes in the flow rate of a source gas are generated due to changes in the valve opening, it is possible to maintain the pressure of the liquid source at a constant pressure while still keeping the flow rate of the liquid source at equal to or less than the limit flow rate. Accordingly, even in an ALD/ALE process, a desired quantity of source gas is supplied to the chamber CN without any portion of this source gas having to be discarded, and it is possible to prevent any liquid source being supplied to the chamber CN while still in a liquid state.

Variant examples of the first embodiment will now be described.

It is also possible for the control valve 1 to be a normally closed type valve that, in a state in which voltage is not being applied thereto, remains in a fully closed state. In a case in which a normally closed type of valve is used for the control valve 1, then a structure may be employed in which the manipulated variable deciding unit 43 selects the smaller voltage out of the first voltage and the second voltage, and inputs this smaller voltage into the control valve 1.

Figure 8:
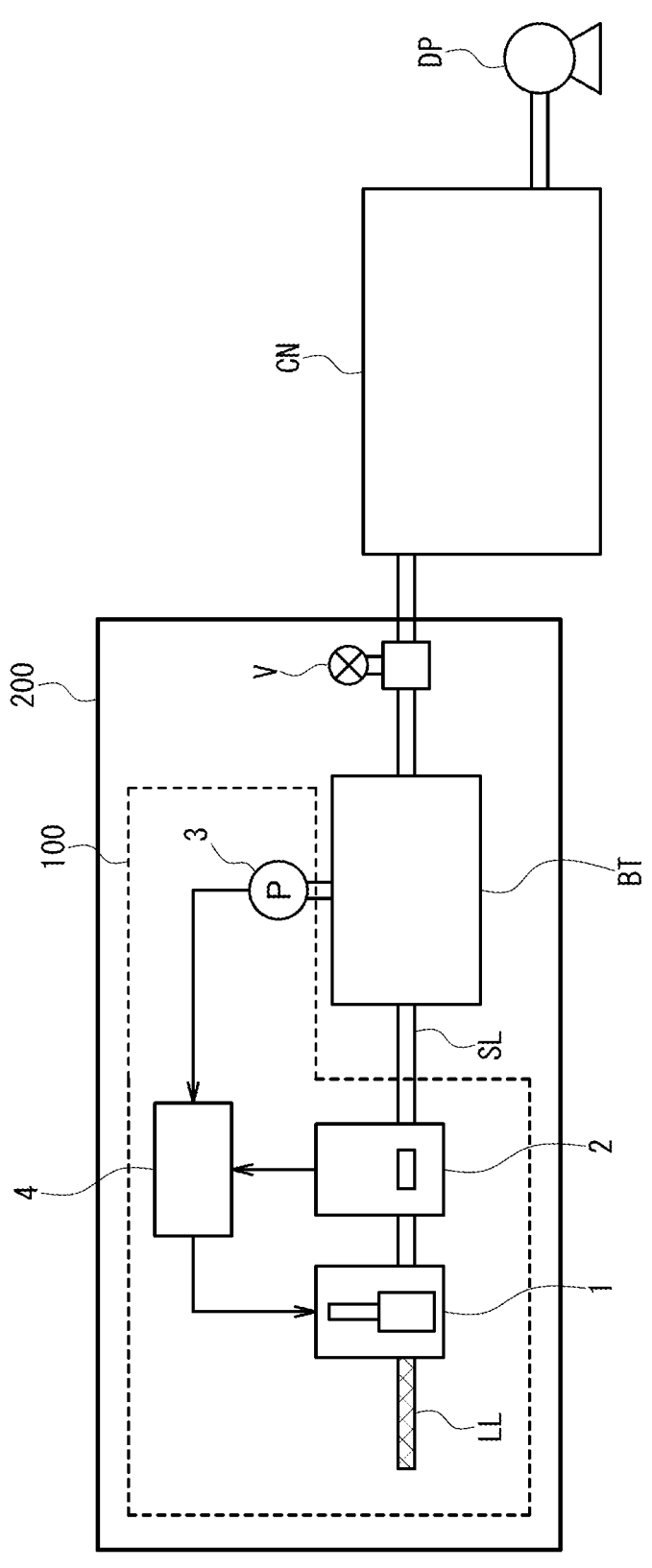
FIG. 8 is a schematic view showing a first variant example of the liquid source vaporization apparatus of the first embodiment of the present invention.

The flow rate that is used for the flow rate feedback is not limited to the measured flow rate measured by the flow rate sensor 2 that is provided on the liquid line LL through which the liquid source flows. As is shown in FIG. 8, it is also possible to use measured flow rates from a flow rate sensor 2 that is provided on the supply line SL, which is on the downstream side of the control valve 1, and that is formed so as to measure the flow rate of a source gas. In this case, an upper limit flow rate up until which the liquid source is able to be vaporized is defined for the flow rate of the source gas, and a value that is smaller by a predetermined value than this upper limit flow rate may be used by the first manipulated variable calculation unit 41 as the limit flow rate. In the case of this type of liquid source vaporization apparatus 100, the supply line SL, which is the downstream side of the control valve 1, is placed in a temperature-controlled state so as to be maintained at a predetermined temperature or higher, and a high temperature-capable flow rate sensor that is able to operate at the predetermined temperature or higher may be used as the flow rate sensor 2.

Figure 9:
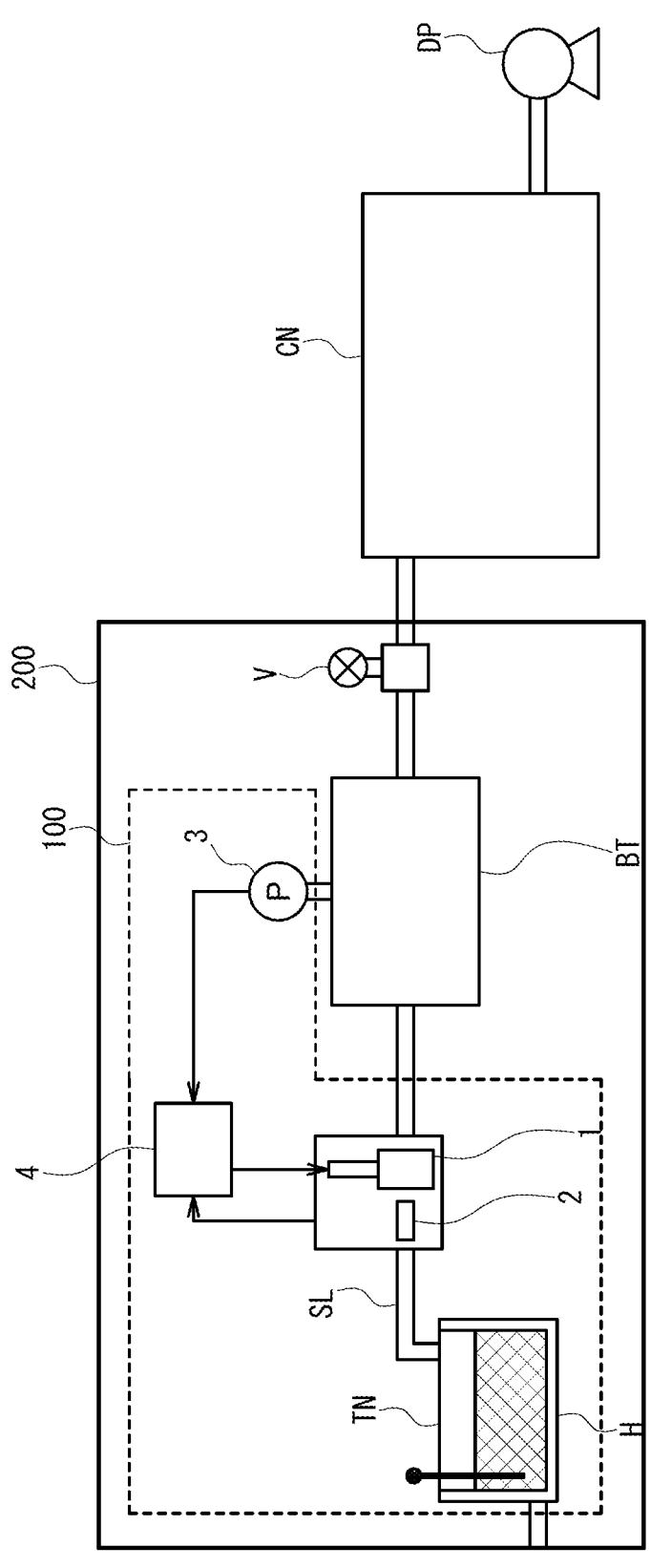
FIG. 9 is a schematic view showing a second variant example of the liquid source vaporization apparatus of the first embodiment of the present invention.

Moreover, the liquid source vaporization apparatus 100 is not limited to being an injection type of vaporization apparatus, and various types of vaporization apparatus may be used. For example, as is shown in FIG. 9, the liquid source vaporization apparatus 100 may also be configured as a baking type of vaporization apparatus. More specifically, the liquid source vaporization apparatus 100 may be provided with a tank TN which contains a liquid source, a heater H that heats the tank TN, the supply line SL that is connected to the tank TN such that source gas obtained by vaporizing the liquid source may be extracted from an upper portion of the tank TN, the flow rate sensor 2 that is provided on the supply line SL, and the control valve 1. In this liquid source vaporization apparatus 100, the flow rate of source gas is measured by the flow rate sensor 2 on the upstream side of the control valve 1. In this case as well, an upper limit flow rate up until which the liquid source within the tank is able to be vaporized is defined for the flow rate of the source gas, and a value that is smaller by a predetermined value than this upper limit flow rate may be used by the first manipulated variable calculation unit 41 as the limit flow rate. If this type of liquid source vaporization apparatus is used, then because vaporized source gas is supplied to the control valve 1, the liquid source can be reliably prevented from flowing onto the downstream side of the control valve 1. In addition, because the control valve 1 is controlled by the valve controller 4 such that the vaporization supply capability of source gas is not exceeded, it is possible to prevent a situation from arising in which, for example, because of the source gas vaporization supply capability being insufficient, the control valve 1 becomes stuck in a fully open state and is no longer able to be controlled.

Moreover, the liquid source vaporization apparatus 100 may also be one in which a source gas is generated by performing bubbling on a liquid source using a carrier gas. In this case, an upper limit flow rate up until which the liquid source is able to be vaporized is defined for the flow rate of the mixture gas formed by the source gas and the carrier gas, and a value that is smaller by a predetermined value than this upper limit flow rate may be used by the first manipulated variable calculation unit 41 as the limit flow rate.

Figure 10:
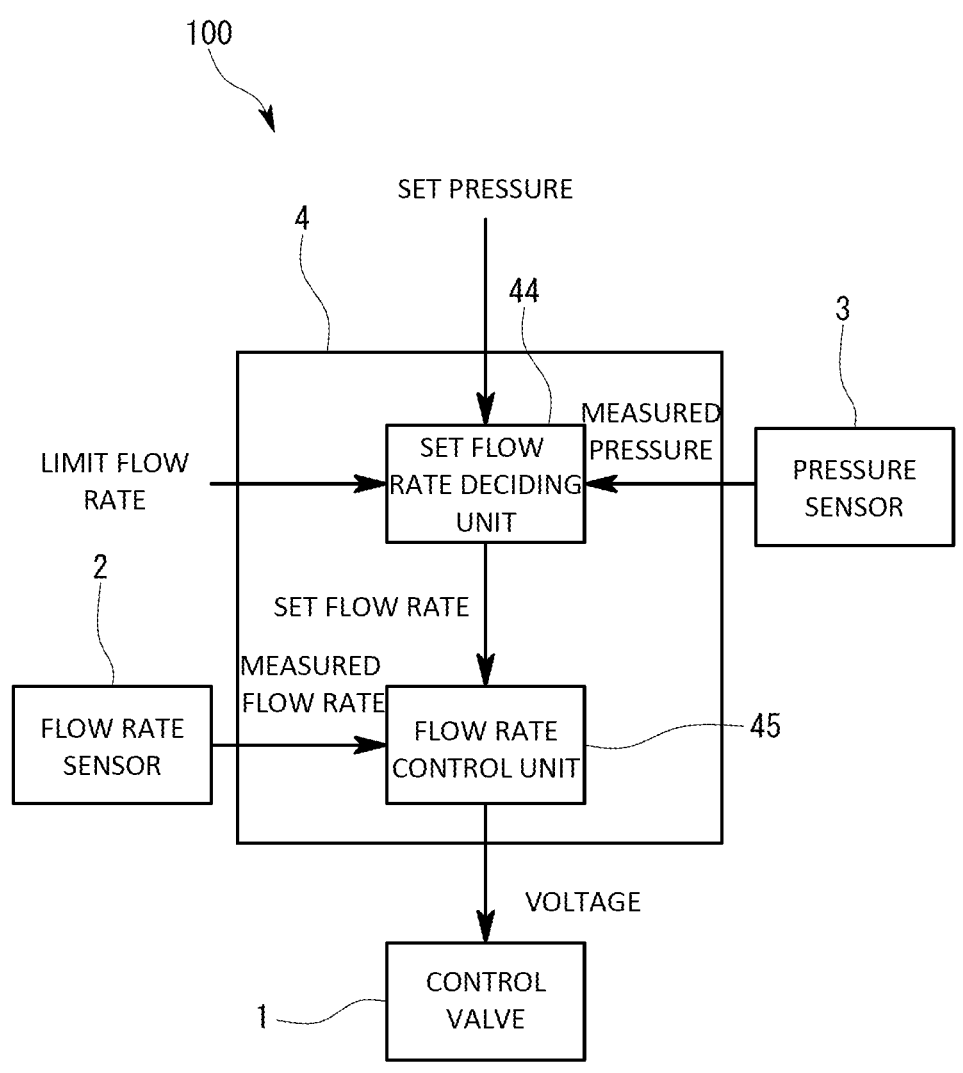
FIG. 10 is a schematic view showing a liquid source vaporization apparatus according to a second embodiment of the present invention.

Next, the liquid source vaporization apparatus 100 according to a second embodiment will be described with reference to FIG. 10.

In the liquid source vaporization apparatus 100 according to the second embodiment, the structure of the valve controller 4 is different from that used in the first embodiment. More specifically, as is shown in a function block diagram in FIG. 10, the liquid source vaporization apparatus 100 according to the second embodiment differs from that used in the first embodiment in being provided with a flow rate control unit 45 that controls the control valve 1 based on a deviation between a measured flow rate and a set flow rate, and a flow rate setting unit 44 that sets a set flow rate that is equal to or less than a limit flow rate in the flow rate control unit 45 such that a deviation between the measured pressure and the set pressure is reduced.

Here, in a case in which the measured pressure is larger than the set pressure, the flow rate setting unit 44 reduces the set flow rate, decreases the flow rate of the liquid source, and decreases the quantity of source gas that is supplied. In addition, in a case in which the measured pressure is smaller than the set pressure, the flow rate setting unit 44 raises the set flow rate, increases the flow rate of the liquid source, and increases the quantity of source gas that is supplied.

Figure 11:
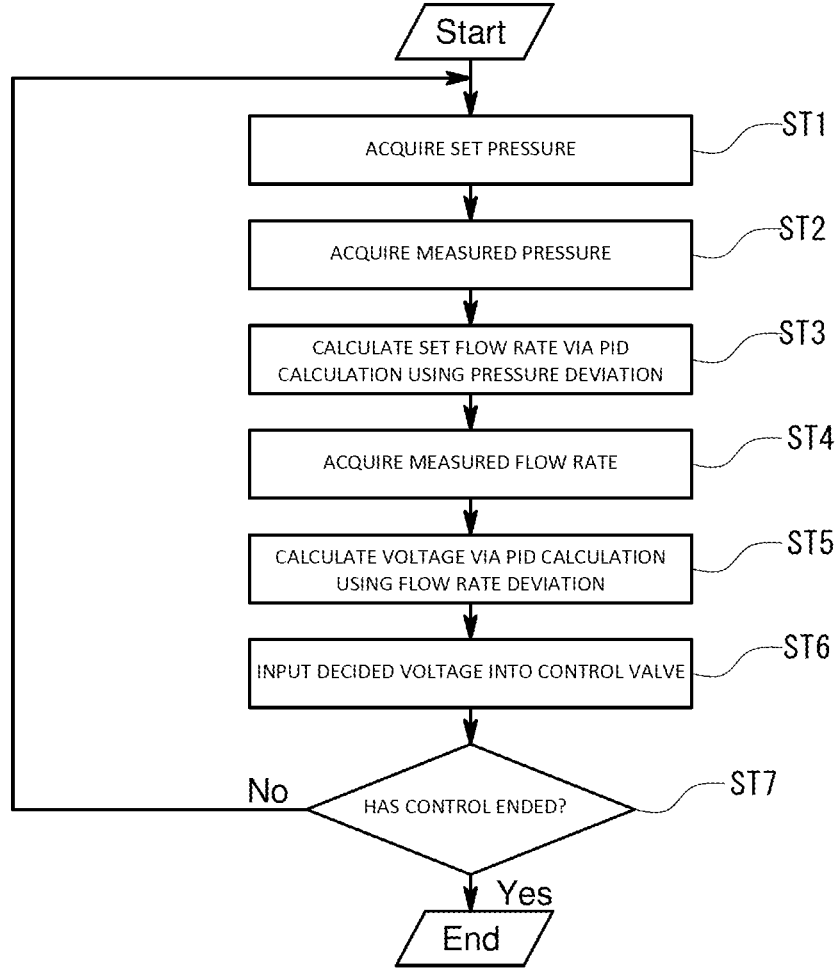
FIG. 11 is a function block diagram showing the liquid source vaporization apparatus of the second embodiment.
Figure 12:
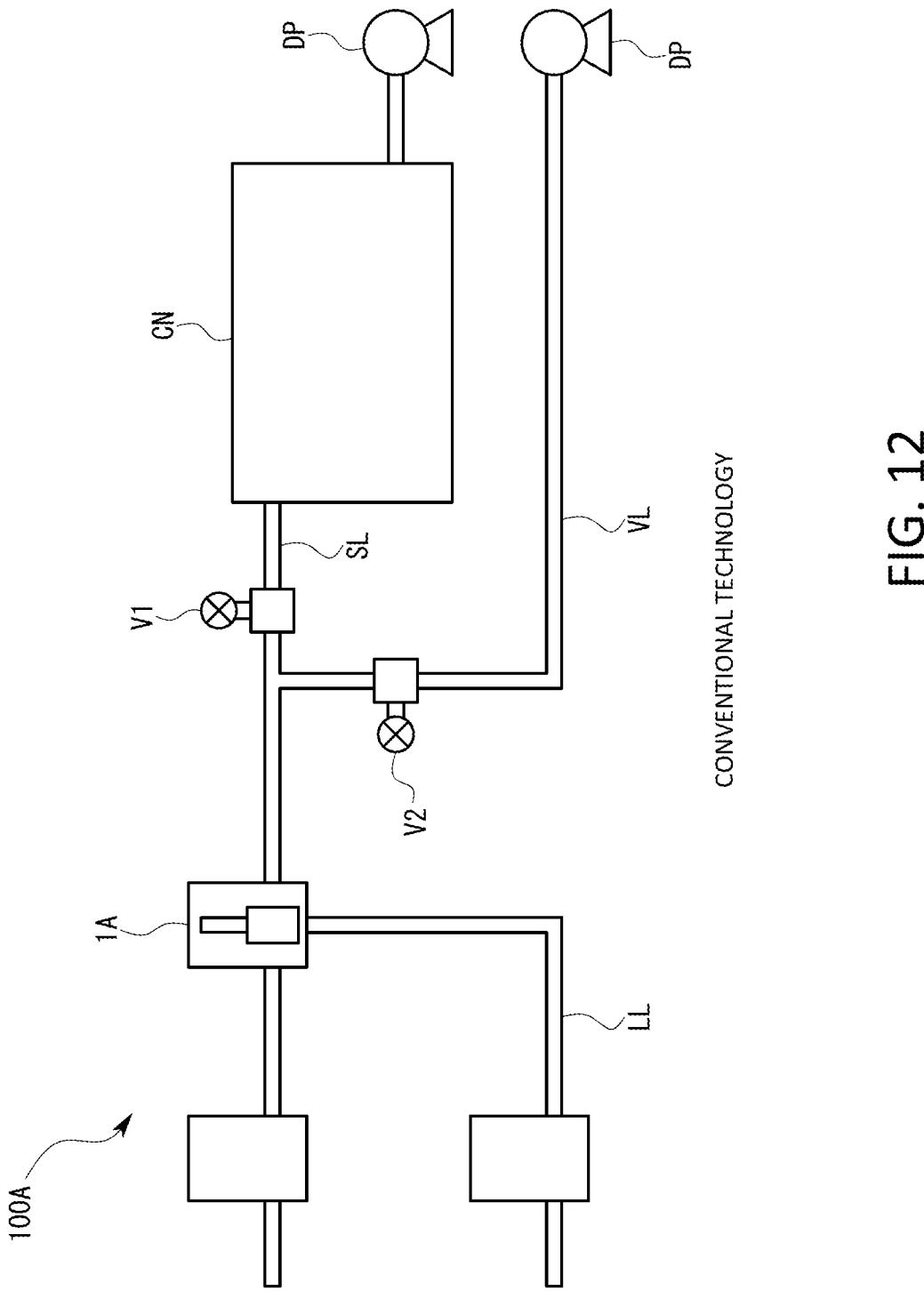
FIG. 12 is a schematic view showing a conventional liquid source vaporization apparatus.
Figure 13A:
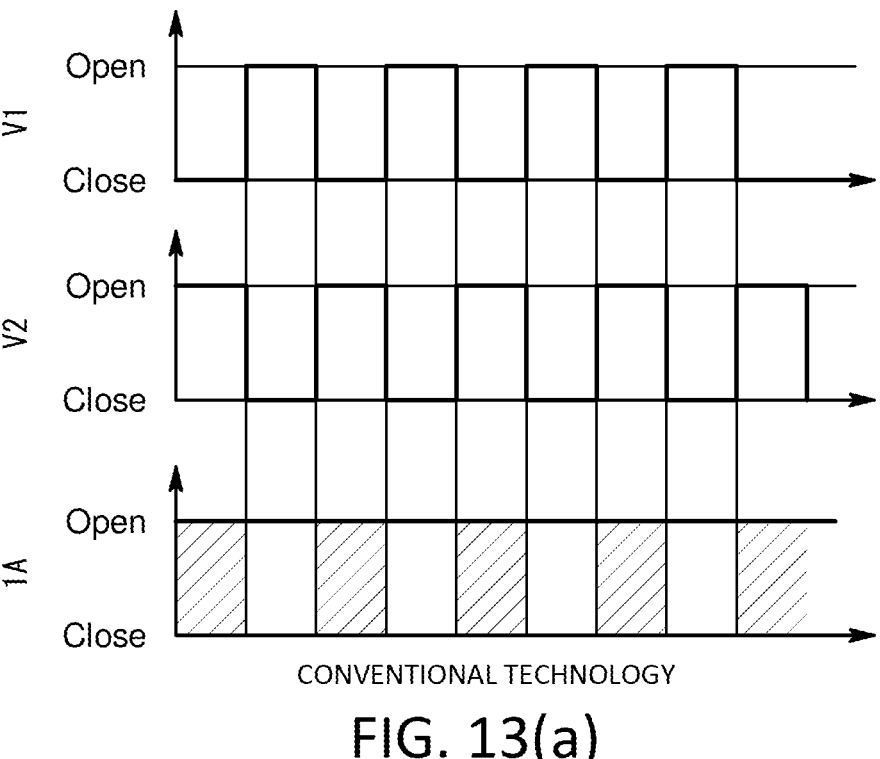
FIGS. 13(*a*) and 13(*b*) are timing charts showing an operation of a conventional liquid source vaporization apparatus.
Figure 13B:
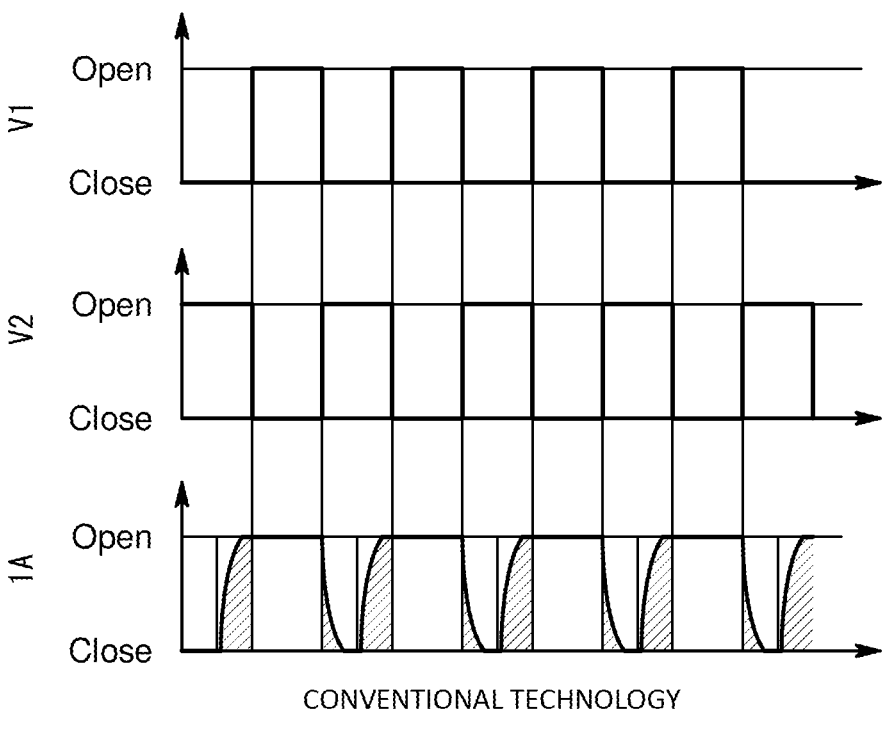

An operation of the liquid source vaporization apparatus 100 of the second embodiment that is formed in the above manner will now be described with reference to the flow chart shown in FIG. 11.

The flow rate setting unit 44 acquires a set pressure (step ST1), and then acquires a measured pressure from the pressure sensor 3 (step ST2). Next, the flow rate setting unit 44 calculates the deviation between the set pressure and the measured pressure, and then calculates the set flow rate by performing a PID calculation on this deviation between the pressures (step ST3). Here, if the calculated set flow rate is larger than the limit flow rate, the flow rate setting unit 44 inputs the limit flow rate into the flow rate control unit 45 as the set flow rate. If, on the other hand, the calculated set flow rate is smaller than the limit flow rate, the flow rate setting unit 44 inputs the calculated set flow rate unmodified into the flow rate control unit 45. In this way, the flow rate setting unit 44 decides the set flow rate to be input into the flow rate control unit 45 using pressure feedback from the downstream side of the control valve 1.

Next, the flow rate control unit 45 acquires the measured flow rate from the flow rate sensor 2 (step ST4). In addition, the flow rate control unit 45 calculates the deviation between the limit flow rate and the measured flow rate, and then calculates the voltage to be applied to the control valve 1 by performing a PID calculation on this deviation between the flow rates (step ST5). In this way, the flow rate control unit 45 calculates the voltage to be applied to the control valve 1 using flow rate feedback from the liquid source, and applies this voltage to the control valve 1 (step ST6).

Lastly, a determination is made as to whether or not this control is still continuing (step ST7), and if the control is continuing then step ST1 through step ST6 are repeated.

In the liquid source vaporization apparatus 100 of the second embodiment which is configured in this way, because the set flow rate input by the flow rate setting unit 44 into the flow rate control unit 45 is equal to or less than the limit flow rate, it is possible to prevent the control valve 1 performing a type of operation such as supplying a flow rate that is greater than the limit flow rate, while also ensuring that the pressure on the downstream side of the control valve 1 tracks the set pressure.

Accordingly, at the same time as ensuring that a liquid source passing through the control valve 1 is fully vaporized and changed into source gas, it is also possible to ensure that the pressure thereof is maintained at a set pressure. For this reason, in the same way as in the first embodiment, even in an ALD/ALE process, a desired quantity of source gas is supplied to the chamber CN without any portion of this source gas having to be discarded, and it is possible to prevent any liquid source still in a liquid state being supplied to the chamber CN.

Variant examples of the second embodiment will now be described.

In the same way as when variant examples of the first embodiment were described, in the second embodiment as well, the liquid source vaporization apparatus 100 is not limited to being an injection type of vaporization apparatus, and various types of vaporization apparatus may be used.

Moreover, the flow rate measured by the flow rate sensor 2 may be any one of the flow rate of the liquid source, the flow rate of the source gas, or the flow rate of a mixture gas obtained by mixing the source gas with a carrier gas, and a suitable limit flow rate may be set in accordance with the flow rate that is measured.

Additional embodiments will now be described. In each of these embodiments, a case is illustrated in which there is only one chamber that is serving as the source gas supply object, however, it is also possible for a plurality of supply lines that each have a control valve and a pressure sensor to be provided in parallel. More specifically, these supply lines may be in the form of a main flow path and a plurality of branch flow paths that branch off from the downstream side of the main flow path, and the respective branch flow paths may be individually connected to mutually different source gas supply objects. In other words, the branch flow paths may be connected in such a way that source gas may be supplied from mutually different locations to the same chamber, or alternatively, the respective branch flow paths may be connected to mutually different chambers. Moreover, it is also possible for a control valve to be individually provided on each branch flow path, and for pressure control to be performed for a source gas independently in each branch flow path.

Furthermore, it should be understood that the present invention is not limited to the above-described embodiment, and that various modifications and the like may be made thereto insofar as they do not depart from the spirit or scope of the present invention.

REFERENCE CHARACTERS LIST

200 . . . Semiconductor Manufacturing System
100 . . . Liquid Source Vaporization Apparatus
1 . . . Control Valve
2 . . . Flow Rate Sensor
3 . . . Pressure Sensor
4 . . . Valve Control Unit
41 . . . First Manipulated Variable Calculation Unit
42 . . . Second Manipulated Variable Calculation Unit
43 . . . Manipulated Variable Deciding Unit
44 . . . Set Flow Rate Deciding Unit
45 . . . Flow Rate Control Unit

What is claimed is:

1. A liquid source vaporization apparatus comprising:
a control valve that is provided on a flow path along which flows a source fluid, the source fluid originating as a liquid source fluid in a liquid state and being vaporized into a source gas in a gaseous state;
a pressure sensor that is provided on a downstream side of the control valve;

a flow rate sensor that is provided on an upstream side of the pressure sensor, and measures a measured flow rate of the source fluid supplied to the control valve;
memory configured to store a threshold flow rate, which is set based on an upper limit for a flow rate at which the liquid source fluid can be vaporized; and
a processor configured to execute instructions to, while reducing a deviation between a set pressure and a measured pressure measured by the pressure sensor, control the control valve such that the measured flow rate is equal to or less than the threshold flow rate to keep pressure of the source gas flowing on the downstream side of the control valve constant, wherein
the processor is further configured to execute a PID-controlled flow rate feedback loop and a PID-controlled pressure feedback loop, in which the processor is configured to:
based on a deviation between the measured flow rate and the threshold flow rate, calculate a first manipulated variable which is a manipulated variable of the control valve using flow rate feedback from the source fluid in the PID-controlled flow rate feedback loop;
based on a deviation between the measured pressure and the set pressure, calculate a second manipulated variable which is a manipulated variable of the control valve using pressure feedback from the downstream side of the control valve in the PID-controlled pressure feedback loop;
compare the first manipulated variable with the second manipulated variable;
based on the comparison, input only one of the first manipulated variable or the second manipulated variable into the control valve, the control valve being a single control valve that controls the source fluid to a target flow rate with the input of the first manipulated variable in the PID-controlled flow rate feedback loop, and that controls a target pressure of the source fluid with the input of the second manipulated variable in the PID-controlled pressure feedback loop; and
determine if the control of the control valve is still continuing, and, if so, repeat the PID-controlled pressure feedback loop and the PID-controlled flow rate feedback loop.

2. The liquid source vaporization apparatus according to claim 1, wherein the control valve is a normally open type of valve that is in a fully open state when no voltage is being supplied thereto, and
the processor inputs whichever is the larger manipulated variable out of the first manipulated variable and the second manipulated variable into the control valve.

3. The liquid source vaporization apparatus according to claim 1, wherein the control valve is a normally closed type of valve that is in a fully closed state when no voltage is being supplied thereto, and
the processor inputs whichever is the smaller manipulated variable out of the first manipulated variable and the second manipulated variable into the control valve.

4. The liquid source vaporization apparatus according to claim 1, wherein a structure is employed in which the liquid source fluid flows on an upstream side of the control valve, and the source gas obtained by vaporizing the liquid source fluid flows on the downstream side of the control valve, and
the flow rate sensor is provided on the upstream side of the control valve and measures the flow rate of the liquid source fluid.

5. The liquid source vaporization apparatus according to claim 1, wherein a structure is employed in which the liquid source fluid flows on the upstream side of the control valve, and the source gas obtained by vaporizing the liquid source fluid flows on the downstream side of the control valve, and the flow rate sensor is provided on the downstream side of the control valve and measures the flow rate of the source gas.

6. The liquid source vaporization apparatus according to claim 1, wherein the source fluid is supplied to the control valve as the source gas that has been obtained by vaporizing the liquid source fluid that is contained within a tank and heated by a heater, and the resulting vaporized source gas is discharged from the tank interior into the flow path.

7. The liquid source vaporization device according to claim 1, wherein the flow path is formed by a main flow path, and a plurality of branch flow paths that branch off from the downstream side of the main flow path, and the respective branch flow paths are individually connected to mutually different source gas supply objects.

8. The liquid source vaporization device according to claim 7, wherein the control valve is one of a plurality of control valves, and each branch flow path is individually provided with a respective single control valve thereon.

9. The liquid source vaporization device according to claim 1, further comprising a nozzle that is provided on the flow path.

10. The liquid source vaporization device according to claim 1, further comprising a buffer tank that is provided on the downstream side of the control valve.

11. The liquid source vaporization device according to claim 1, wherein a structure is employed in which the downstream side of the control valve is connected to a supply object to which the source gas is supplied, and
all of the source fluid that has passed through the control valve flows into this supply object in a gaseous state as the source gas.

12. A control method for controlling the liquid source vaporization device according to claim 1, the control method comprising:
controlling the control valve such that, at the same time as the deviation between the set pressure and the measured pressure measured by the pressure sensor is reduced, the measured flow rate is equal to or less than the threshold flow rate to keep pressure of the source fluid flowing on the downstream side of the control valve constant;
calculating, based on a deviation between the measured flow rate and the threshold flow rate, a first manipulated variable which is a manipulated variable of the control valve using flow rate feedback from the source fluid in a PID-controlled flow rate feedback loop;
calculating, based on a deviation between the measured pressure and the set pressure, a second manipulated variable which is a manipulated variable of the control valve using pressure feedback from the downstream side of the control valve in a PID-controlled pressure feedback loop;
comparing the first manipulated variable with the second manipulated variable;
based on the comparison, inputting only one of the first manipulated variable or the second manipulated variable into the control valve, the control valve being a single control valve;
controlling the source fluid to achieve the target flow rate with the input of the first manipulated variable in the PID-controlled flow rate feedback loop, and to achieve the target pressure by controlling the single control valve with the input of the second manipulated variable in the PID-controlled pressure feedback loop; and
repeating the PID-controlled pressure feedback loop and PID-controlled flow rate feedback loop if it is determined the control of the control valve is still continuing.

13. A program recording medium on which is recorded a program including instructions used in a liquid source vaporization apparatus that comprises:
a control valve that is provided on a flow path along which flows a source fluid, the source fluid originating as a liquid source fluid in a liquid state and being vaporized into a source gas in a gaseous state;
a pressure sensor that is provided on a downstream side of the control valve;
a flow rate sensor that is provided on an upstream side of the pressure sensor, and measures a measured flow rate of the source fluid supplied to the control valve; and
memory configured to store a threshold flow rate, which is set based on an upper limit for a flow rate at which the liquid source fluid can be vaporized, wherein
the instructions are executed by a processor to, while reducing a deviation between a set pressure and a measured pressure measured by the pressure sensor, control the control valve such that the measured flow rate is equal to or less than the threshold flow rate to keep pressure of the source gas flowing on the downstream side of the control valve constant,
the processor is further configured to execute a PID-controlled flow rate feedback loop and a PID-controlled pressure feedback loop, in which the processor is configured to:
based on a deviation between the measured flow rate and the threshold flow rate, calculate a first manipulated variable which is a manipulated variable of the control valve using flow rate feedback from the source fluid in the PID-controlled flow rate feedback loop;
based on a deviation between the measured pressure and the set pressure, calculate a second manipulated variable which is a manipulated variable of the control valve using pressure feedback from the downstream side of the control valve in the PID-controlled pressure feedback loop;
compare the first manipulated variable with the second manipulated variable; and
based on the comparison, input only one of the first manipulated variable or the second manipulated variable into the control valve,
the control valve is a single control valve,
the source fluid is controlled to achieve a target flow rate with the input of the first manipulated variable in the PID-controlled flow rate feedback loop, and to achieve a target pressure of the source gas by controlling the single control valve with the input of the second manipulated variable in the PID-controlled pressure feedback loop; and
if it is determined the control of the control valve is still continuing, the PID-controlled pressure feedback loop and the PID-controlled flow rate feedback loop are repeated.

14. A liquid source vaporization apparatus comprising:
a control valve that is provided on a flow path along which flows a source fluid, the source fluid originating as a liquid source fluid in a liquid state and being vaporized into a source gas in a gaseous state;
a pressure sensor that is provided on a downstream side of the control valve;

a flow rate sensor that is provided on an upstream side of the pressure sensor, and measures a measured flow rate of the source fluid supplied to the control valve;

memory configured to store a threshold flow rate, which is set based on an upper limit for a flow rate at which the liquid source fluid can be vaporized; and a processor configured to execute instructions to, while reducing a deviation between a set pressure and a measured pressure measured by the pressure sensor, control the control valve such that the measured flow rate is equal to or less than the threshold flow rate to keep pressure of the source gas flowing on the down-stream side of the control valve constant, wherein the processor comprises:

a flow rate control unit that controls the control valve in a PID-controlled flow rate feedback loop based on a deviation between the measured flow rate and a set flow rate; and a flow rate setting unit that sets a set flow rate that is equal to or less than the limit flow rate in the flow rate control unit in a PID-controlled pressure feedback loop such that the deviation between the measured pressure and the set pressure is reduced.

15. The liquid source vaporization apparatus according to claim 14, wherein, in a case in which the measured pressure is larger than the set pressure, the processor reduces the set flow rate, and in a case in which the measured pressure is smaller than the set pressure, the processor increases the set flow rate.

\* \* \* \* \*